US010037062B1

(12) United States Patent
Bhopte et al.

(10) Patent No.: US 10,037,062 B1
(45) Date of Patent: Jul. 31, 2018

(54) THERMAL VENTING DEVICE WITH PRESSURIZED PLENUM

(71) Applicant: Microsoft Technology Licensing, LLC, Redmond, WA (US)

(72) Inventors: Siddharth Bhopte, Redmond, WA (US); Daniel J. Dummer, Seattle, WA (US); Virendra Jadhav, Redmond, WA (US); Andrew Douglas Delano, Woodinville, WA (US)

(73) Assignee: MICROSOFT TECHNOLOGY LICENSING, LLC, Redmond, WA (US)

( * ) Notice: Subject to any disclaimer, the term of this patent is extended or adjusted under 35 U.S.C. 154(b) by 0 days.

(21) Appl. No.: 15/462,562

(22) Filed: Mar. 17, 2017

(51) Int. Cl.
*H05K 7/20* (2006.01)
*G06F 1/20* (2006.01)
*G06F 1/18* (2006.01)

(52) U.S. Cl.
CPC .............. *G06F 1/206* (2013.01); *G06F 1/183* (2013.01); *H05K 7/20145* (2013.01); *H05K 7/20154* (2013.01); *H05K 7/20172* (2013.01); *H05K 7/20209* (2013.01)

(58) Field of Classification Search
None
See application file for complete search history.

(56) References Cited

U.S. PATENT DOCUMENTS

| 4,277,816 | A | 7/1981 | Dunn et al. |
| 5,196,989 | A | 3/1993 | Zsolnay |
| 6,280,318 | B1 | 8/2001 | Criss-Puszkiewicz et al. |
| 6,550,531 | B1 | 4/2003 | Searls et al. |
| 6,747,872 | B1 | 6/2004 | Patel et al. |
| 7,086,459 | B2 | 8/2006 | Beitelmal et al. |
| 7,212,403 | B2 | 5/2007 | Rockenfeller |
| 7,277,283 | B2 | 10/2007 | Campbell et al. |
| 7,405,930 | B2 | 7/2008 | Hongo et al. |
| 7,495,914 | B2 | 2/2009 | Tilton et al. |
| 7,508,663 | B2 | 3/2009 | Coglitore |
| 7,511,957 | B2 | 3/2009 | Campbell et al. |
| 7,839,630 | B2 | 11/2010 | Hwang et al. |

(Continued)

FOREIGN PATENT DOCUMENTS

JP S6425599 A 1/1989

OTHER PUBLICATIONS

Mellor, Dave, "A comparative analysis of power supply single speed air mover and an enitre electronics enclosure system fan", http://cyntech.co.uk/blog/cooling-power-supplies/, Published on Jul. 6, 2015, 4 pages.

(Continued)

*Primary Examiner* — Courtney Smith
(74) *Attorney, Agent, or Firm* — Alleman Hall Creasman & Tuttle LLP

(57) ABSTRACT

A thermal venting device is provided that includes a plenum including an inlet port and a plurality of outlet ports, the plenum being substantially fluidically sealed except for the inlet port and the plurality of outlet ports, the inlet port including an inlet fan configured to pressurize the plenum, each of the plurality of outlet ports being configured to direct airflow from the pressurized plenum toward different electronic components of a plurality of electronic components, and each of the plurality of outlet ports including respective resistive elements having varied airflow resistances configured to bias airflow through the plurality of outlet ports.

15 Claims, 10 Drawing Sheets

(56) References Cited

U.S. PATENT DOCUMENTS

| | | |
|---|---|---|
| 7,864,541 B2 | 1/2011 | Lucero et al. |
| 8,014,150 B2 | 9/2011 | Campbell et al. |
| 8,194,406 B2 | 6/2012 | Campbell et al. |
| 8,403,736 B2 | 3/2013 | Rasmussen et al. |
| 8,806,749 B2 | 8/2014 | Campbell et al. |
| 8,995,123 B2 | 3/2015 | Marten et al. |
| 9,089,078 B2 | 7/2015 | Branton |
| 9,223,360 B2 | 12/2015 | Attlesey |
| 2002/0054479 A1 | 5/2002 | Wu |
| 2002/0159232 A1 | 10/2002 | Beitelmal et al. |
| 2003/0053293 A1 | 3/2003 | Beitelmal et al. |
| 2006/0019597 A1 | 1/2006 | Beitelmal et al. |
| 2008/0117589 A1 | 5/2008 | Carrera et al. |
| 2009/0324403 A1 | 12/2009 | Zheng |
| 2010/0097760 A1 | 4/2010 | Azar et al. |
| 2016/0135329 A1 | 5/2016 | Lewis, II |
| 2016/0165751 A1 | 6/2016 | Varadarajan et al. |

OTHER PUBLICATIONS

"Vapor Chamber", http://cmu.coolermaster.com/vapor-chamber/, Published on: Sep. 16, 2014, 4 pages.

"International Search Report and Written Opinion Issued in PCT Application No. PCT/US2018/021903", dated May 22, 2018, 13 Pages.

THERMAL VENTING DEVICE WITH PRESSURIZED PLENUM

BACKGROUND

Modular computing devices house several electronic components that may generate heat while operating, and which may require cooling during operation. Fans may be provided to blow cooling air to cool such components. However, one challenge of current cooling systems in such electronic devices is delivering an appropriate amount of cooling air to cool multiple components, each of which generates a different amount of heat. In such cases, some components may not receive sufficient cooling air. Without adequate cooling, the heat generated by the electronic components may raise the temperature of one or more of the electronic components to a level that may potentially degrade performance and reliability of the electronic components.

SUMMARY

To address the above issues, a thermal venting device is provided. The thermal venting device may include a plenum including an inlet port and a plurality of outlet ports, the plenum being substantially fluidically sealed except for the inlet port and the plurality of outlet ports, the inlet port including an inlet fan configured to pressurize the plenum, each of the plurality of outlet ports being configured to direct airflow from the pressurized plenum toward different electronic components of a plurality of electronic components, and each of the plurality of outlet ports including respective resistive elements having varied airflow resistances configured to bias airflow through the plurality of outlet ports.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter. Furthermore, the claimed subject matter is not limited to implementations that solve any or all disadvantages noted in any part of this disclosure.

DETAILED DESCRIPTION

Figure 1:
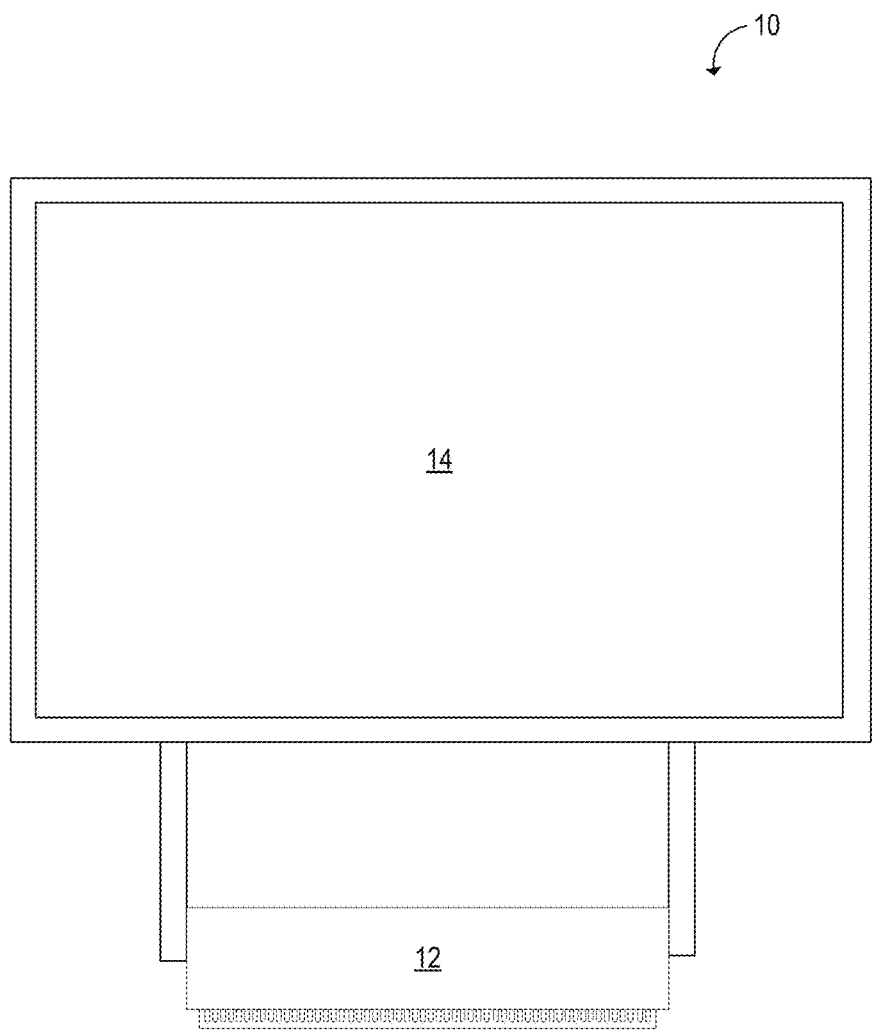
FIG. 1 is a schematic view that shows an example computing system including an example computing device of the present description.

FIG. 1 illustrates a computing system 10 that includes a computing device 12 and a display 14. The computing device 12 may, for example, take the form of a desktop computing device. In other examples, the computing device 12 may take the form of a server device, a modular server rack including a plurality of server devices, a laptop computing device, a large format display device, or any other suitable form of computing device.

Figure 2:
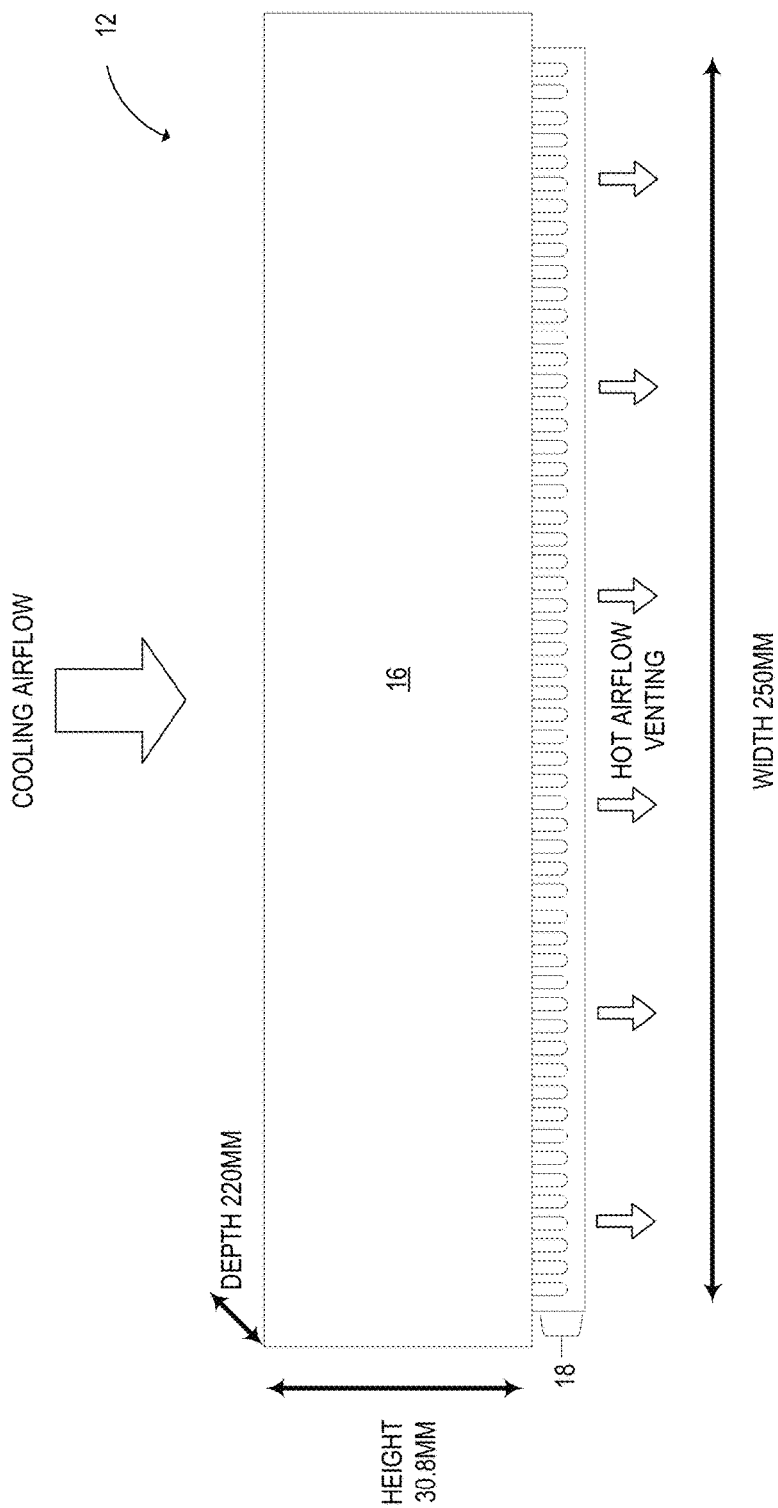
FIG. 2 is a schematic view that shows airflow through the example computing device of FIG. 1.

FIG. 2 shows a schematic view of the computing device 12. In the illustrated example, the computing device 12 includes a housing 16 that contains various electronic components of the computing device 12. As a specific example, the housing 16 may have a length of 250 millimeters, and a width of 220 millimeters. However, it will be appreciated that the housing 16 may have other suitable dimensions, such as, for example, a width of at least 200 millimeters, a height of at least 25 millimeters, and a depth of at least 200 millimeters. As another example, the housing 16 may be a housing of a server rack that contains a plurality of server devices, each including a set of electronic components. In this example, the housing 16 may have any suitable server rack dimensions, such as 42U server rack dimensions which may include an external width of 600 millimeters, a height of 2,000 millimeters, and a depth of 1200 millimeters. It will be appreciated that the above described dimensions of the housing 16 are merely exemplary, and that the housing 16 may have any other suitable dimensions not specifically described above.

In the example illustrated in FIG. 2, the housing 16 may include openings on a top side to allow external airflow into the housing 16 in an impinging airflow configuration. In another example, the housing 16 may include openings on the sides of the housing 16 to allow external airflow into the housing 16 in a lateral airflow configuration. As shown, the housing 16 may further include venting openings 18 on a bottom side of the housing 16 that allow internal airflow to be vented from the housing 16. Thus, in these examples of housing 16, external airflow is pulled from outside of the housing 16 and used to cool electronic components mounted inside the housing 16, and the heated air is subsequently vented from the housing 16 via the venting openings 18.

Figure 3:
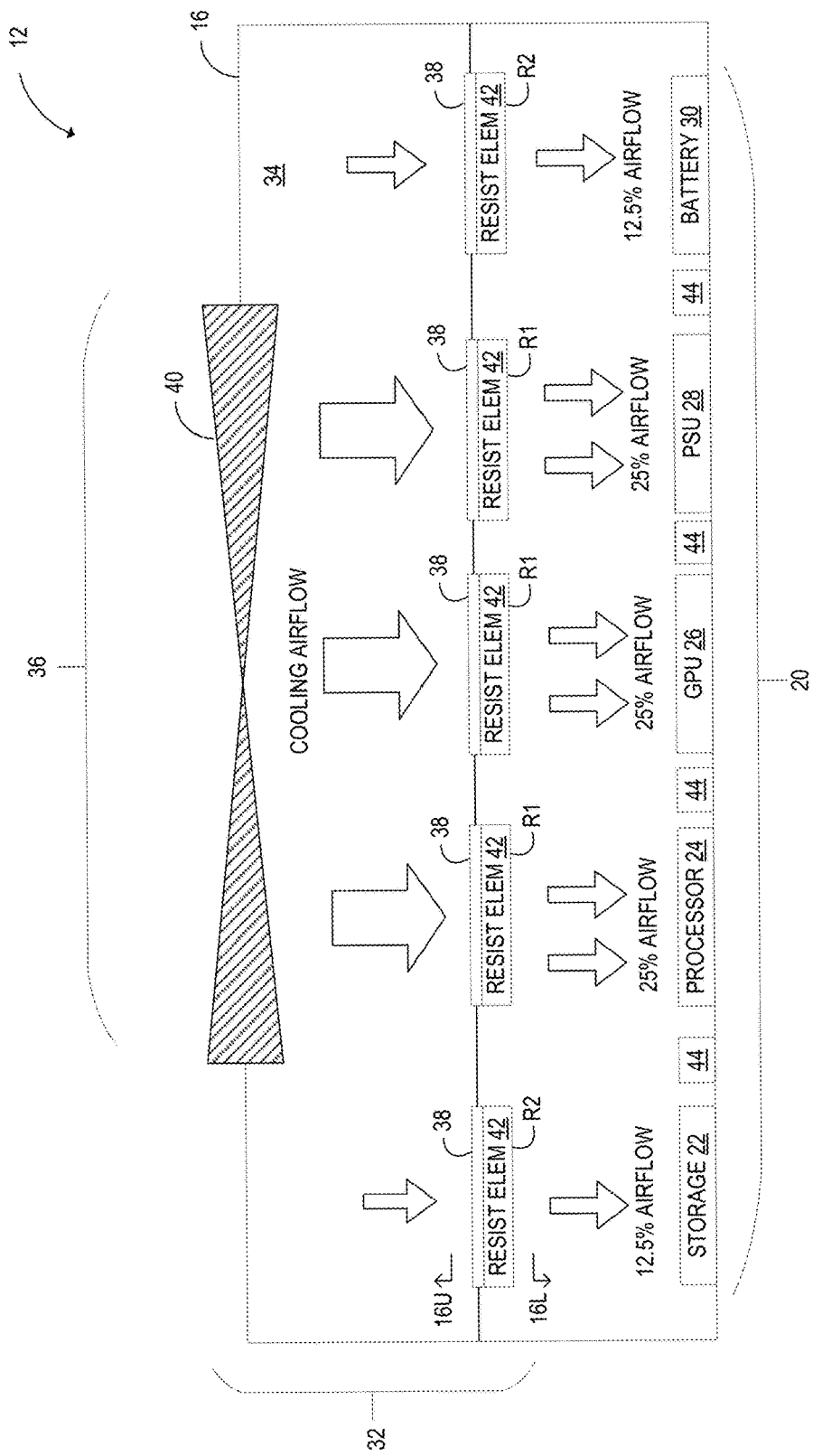
FIG. 3 is a schematic view that shows an impinging airflow layout of the example computing device of FIG. 1.

Now turning to FIG. 3, an example internal structure of the housing 16 of example computing device 12 is illustrated. In this example, the housing 16 includes a plurality of electronic components 20 mounted on a lower end 16L of the housing 16. As shown, the plurality of electronic components 20 may include a non-volatile storage device 22, a processor 24, a graphics processing unit (GPU) 26, a power supply unit (PSU) 28, and a battery 30. However, it will be appreciated that the above described examples of the plurality of electronic components 20 are merely exemplary, and that other electronic components, such as speakers, sounds cards, networking components, etc., not specifically mentioned above may also be mounted in the housing 16.

Operation of the plurality of electronic components may generally degrade at high temperature levels. For example, the non-volatile storage device 22, which may take the form of a hard drive, may have reduced performance and a higher probability of failure at temperatures above 50 degrees Celsius. As another example, the processor 24 may have reduced performance and a higher probability of failure at temperatures above 60 degrees Celsius. Accordingly, the housing 16 includes a thermal venting device 32 configured to provide cooling airflow for the plurality of electronic components 20, the cooling airflow supplied continuously or controlled based on a detected temperature or operating state of the electronic components.

In the illustrated example, the thermal venting device 32 includes a plenum 34 mounted on an upper end 16U of the housing 16. The plenum is substantially fluidically sealed except for an inlet port 36 and a plurality of outlet ports 38. That is, the plenum 34 is fluidically sealed such that air may substantially only enter the plenum via the inlet port 36 and may substantially only exit the plenum via the plurality of outlet ports 38. As shown, the inlet port 36 includes an inlet fan 40 configured to pressurize the plenum 34. While the illustrated example only shows one inlet port 36 and one inlet fan 40, the plenum may include any suitable number of inlet ports and inlet fans. A pressure level of the plenum 34 may be controlled via a fan speed of the inlet fan 40, which pushes air external to the housing 16 into the plenum 34. By increasing pressure within the plenum 34, a pressure drop is generated between the plenum 34 and a lower end 16L of the housing 16 which contains the plurality of electronic components 20. Thus, there will be airflow from the plenum 34 toward lower end 16L of the housing 16 through the plurality of outlet ports 38.

In the illustrated example, the plenum 34 takes the form of a rectangular box with an internal space that is substantially fluidically sealed except for the inlet port 36 and the plurality of outlet ports 38. However, the plenum 34 may take other forms, such as, for example, a semi-hemispherical shape, a rounded rectangular box, a cylindrical shape, or another suitable shape with an internal space.

In one example, each of the plurality of outlet ports 38 is configured to direct airflow from the pressurized plenum 34 toward different electronic components of a plurality of electronic components 20. In the illustrated example, the plurality of outlet ports 38 are located directly above the locations of the plurality of electronic components 20 in the lower end 16L of the housing 16. As air travels from the pressurized plenum 34 through the plurality of outlet ports 38 due to the pressure drop, streams of airflow are directed onto each of the plurality of electronic components 20 by the plurality of outlet ports 38. It will be appreciated that each electronic component receives its own separate stream of cooling air from the plenum 34 rather than a single airflow being used to cool multiple electronic components.

As illustrated in FIG. 3, each of the plurality of outlet ports 38 includes respective resistive elements 42 having varied airflow resistances R1/R2 configured to bias airflow through the plurality of outlet ports 28. In one example, at least one resistive element has a first airflow resistance R1 and at least one resistive element has a second airflow resistance R2, wherein the first airflow resistance R1 is lower than the second airflow resistance R2. In the example illustrated in FIG. 3, three resistive elements located above the processor 24, the GPU 26, and the PSU 28, have the first airflow resistance R1. Further, two resistive elements located above the non-volatile storage device 22 and the battery 30 have the second airflow resistance R2. As the first airflow resistance R1 is lower than the second airflow resistance R2, air flowing from the pressurized plenum 34 to the lower end 16L of the housing 16 will be biased such that more air flows through the three resistive elements having the first airflow resistance R1 compared to the two resistive elements having the second airflow resistance R2.

In this manner, the airflow through the outlet ports 38 is biased by the resistive elements 42 such that more airflow is directed toward the processor 24 than the non-volatile storage device 22 of the plurality of electronic devices 20. Similarly, more airflow is directed toward the processor 24, the GPU 26, and the PSU 28, compared to the airflow that is directed toward the non-volatile storage device 22 and the battery 30. It will be appreciated that the example airflow resistances and the resulting airflow bias shown in FIG. 3 are merely exemplary, and any other configuration of resistive element airflow resistances may be utilized to achieve a suitable airflow ratio between the plurality of outlet ports 38. For example, each resistive element may have a different airflow resistance value than each other resistive element. As another example, the outlet port directing air toward the processor 24 may have a resistive element having an airflow resistance that is lower than the outlet port directing air toward the GPU 26, thus causing more air to be directed toward the processor 24 than the GPU 26.

In this manner, the resistive elements 42 for the plurality of outlet ports 38 may be selected to achieve a suitable ratio of airflow that is delivered to each electronic component. In the example illustrated in FIG. 3, the resistive elements 42 for the plurality of outlet ports 38 are configured such that 25% of the airflow from the pressurized plenum 34 flows toward each of the processor 24, the GPU 26, and the PSU 28, and 12.5% of the airflow from the pressurized plenum 34 flows toward each of the non-volatile storage device 22 and the battery 30. However, it will be appreciated that the resistive elements may be configured to bias the airflow to achieve a target airflow ratio. For example, 30% of airflow toward the processor 24, 30% of airflow toward the GPU 26, 20% of airflow to the PSU 28, 10% of airflow to the non-volatile storage device 22, and 10% of airflow to the battery 30%. These are merely exemplary values, as many particular configurations are possible.

In the example of FIG. 3, the resistive elements 42 are configured to have static airflow resistances. In this specific example, three of the resistive elements have a static airflow resistance of the first airflow resistance R1, and two of the resistive elements have a static airflow resistance of the second airflow resistance R2. Thus, it will be appreciated that as the pressure of the plenum 34 increases or decreases, the total amount of air that is delivered to each electronic components 20 will also increase or decrease directly corresponding to the airflow ratio. That is, 25% of the increase will be delivered to each of the processor 24, GPU 26, and PSU 28, and 12.5% of the increase will be delivered to each of the non-volatile storage device 22 and battery 30 in the specific example of FIG. 3. Thus, if one particular electronic component has too high of a temperature and requires additional cooling, the fan speed of the inlet fan 40 may be increased to deliver a corresponding amount of additional airflow to that electronic component according to the airflow ratio set by the resistive elements 42.

As shown in FIG. 3, the thermal venting device of example computing device 12 may further include one or more temperature sensors 44 configured to detect temperature values of one or more of the plurality of electronic components 20. In one example, a single temperature sensor 44 may be mounted inside the lower end 16L of the housing 16 and configured to detect an overall temperature value of the plurality of electronic components 20. In another example, each electronic component of the plurality of electronic components 20 may include a temperature sensor 44 configured to detect that electronic component's temperature. In these examples, the processor 24 may be configured to execute an airflow control program that controls a fan speed of the inlet fan 40 based on temperature values detected by the one or more temperature sensors 44 and airflow resistances R1/R2 of the resistive elements 42.

For example, the temperatures of the plurality of electronic components 20 detected by the one or more temperature sensors 44 may be sent to the airflow control program executed by the processor 24. The airflow control program may be configured to increase or decrease the fan speed of the inlet fan 40 based on the received temperature readings. For example, if the detected temperatures of the plurality of electronic components 20 is lower than a threshold temperature value, then the airflow control program may be configured to decrease the fan speed of the inlet fan 40 to save energy. On the other hand, if the detected temperatures of the plurality of electronic components 20 is higher than a threshold temperature value, then the airflow control program may be configured to increase the fan speed of the inlet fan 40 to provide additional cooling airflow to the plurality of electronic components 20. In some configurations, the airflow control program may be executed by a dedicated processing unit separate from the processor 24 of the example computing device 24. For example, the airflow control program may be executed by dedicated hardware of the thermal venting device 32, such as a field programmable gate array, an application specific integrated circuit, etc.

In the example illustrated in FIG. 3, the inlet port 36 and the inlet fan 40 are configured to generate an impinging airflow having an airflow direction that is substantially parallel to an airflow direction of the plurality of outlet ports 38. As shown in FIG. 3, the inlet fan 40 is located above and directed towards the plurality of outlet ports 38, and generates an impinging airflow that is substantially vertical in the illustrated example. Similarly, the plurality of outlet ports 38 also have an airflow direction that is substantially vertical relative to the housing 16. Thus, the inlet fan 40 generates an airflow that is directed at the plurality of outlet ports 38, which may provide an even airflow distribution toward the outlet ports that are directly under the inlet fan 40.

Figure 4:
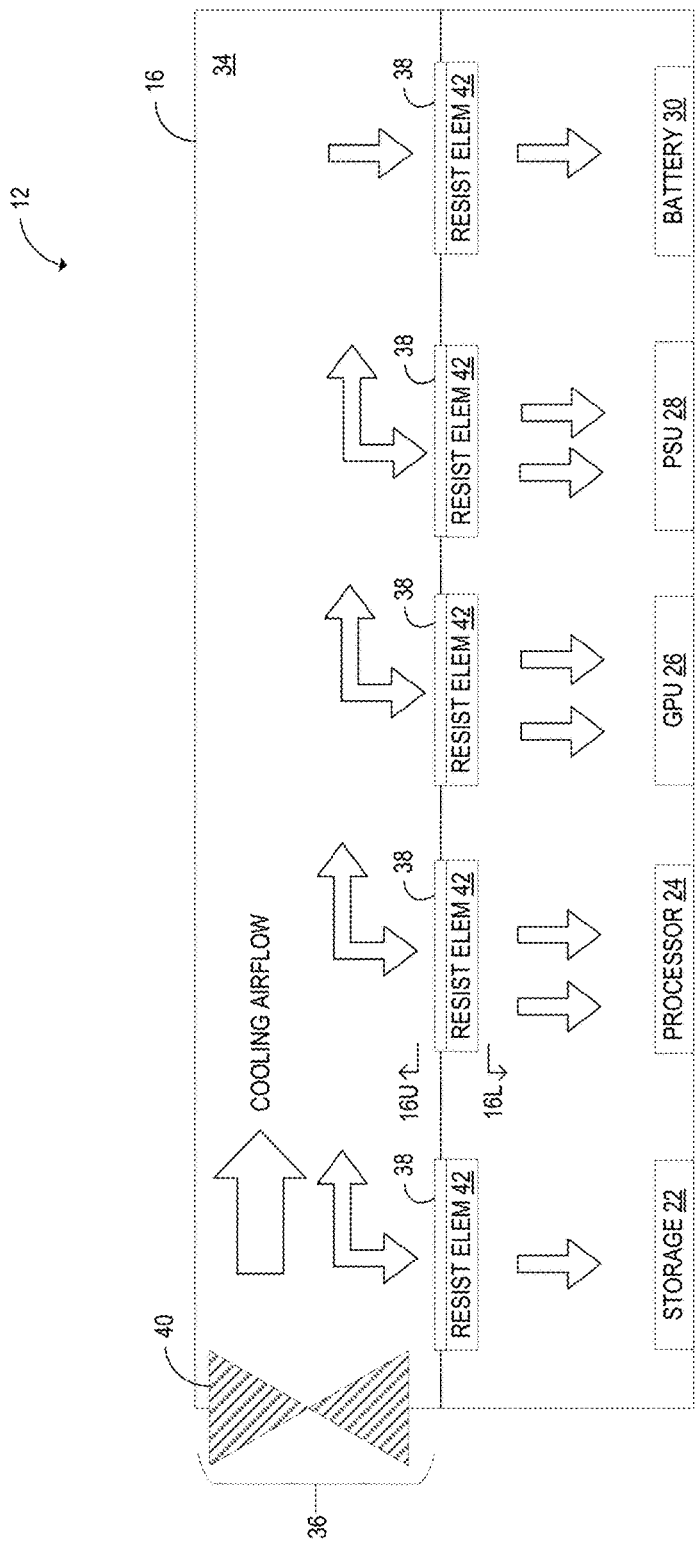
FIG. 4 is a schematic view that shows a lateral airflow layout of the example computing device of FIG. 1.

Turning to FIG. 4, the inlet port 36 and the inlet fan 40 are configured to generate a lateral airflow having an airflow direction that is lateral to an airflow direction of the plurality of outlet ports 38. In this example, the inlet port 36 is located on a side of the plenum 34 and the housing 16, and generates a lateral airflow having an airflow direction across the width of the plenum 34. In this example, the plurality of outlet ports 38 have an airflow direction that is substantially vertical. Thus, the lateral airflow generated by the inlet fan 40 in this example is directed across the plurality of outlet ports 38. An outlet port 38 that is closest to the inlet fan 40 may experience a local pressure that is higher compared to an outlet port that is a farther distance away, as some of the air will travel through the nearby outlet port due to the pressure drop between the plenum 34 and the lower end 16L of the housing 16. Thus, this lateral airflow configuration of the inlet port 36 and inlet fan 40 may generate a more uneven airflow distribution, where outlet ports farther away from the inlet fan 40 may have a smaller local pressure than an outlet port that is closer to the inlet fan 40.

Figure 5:
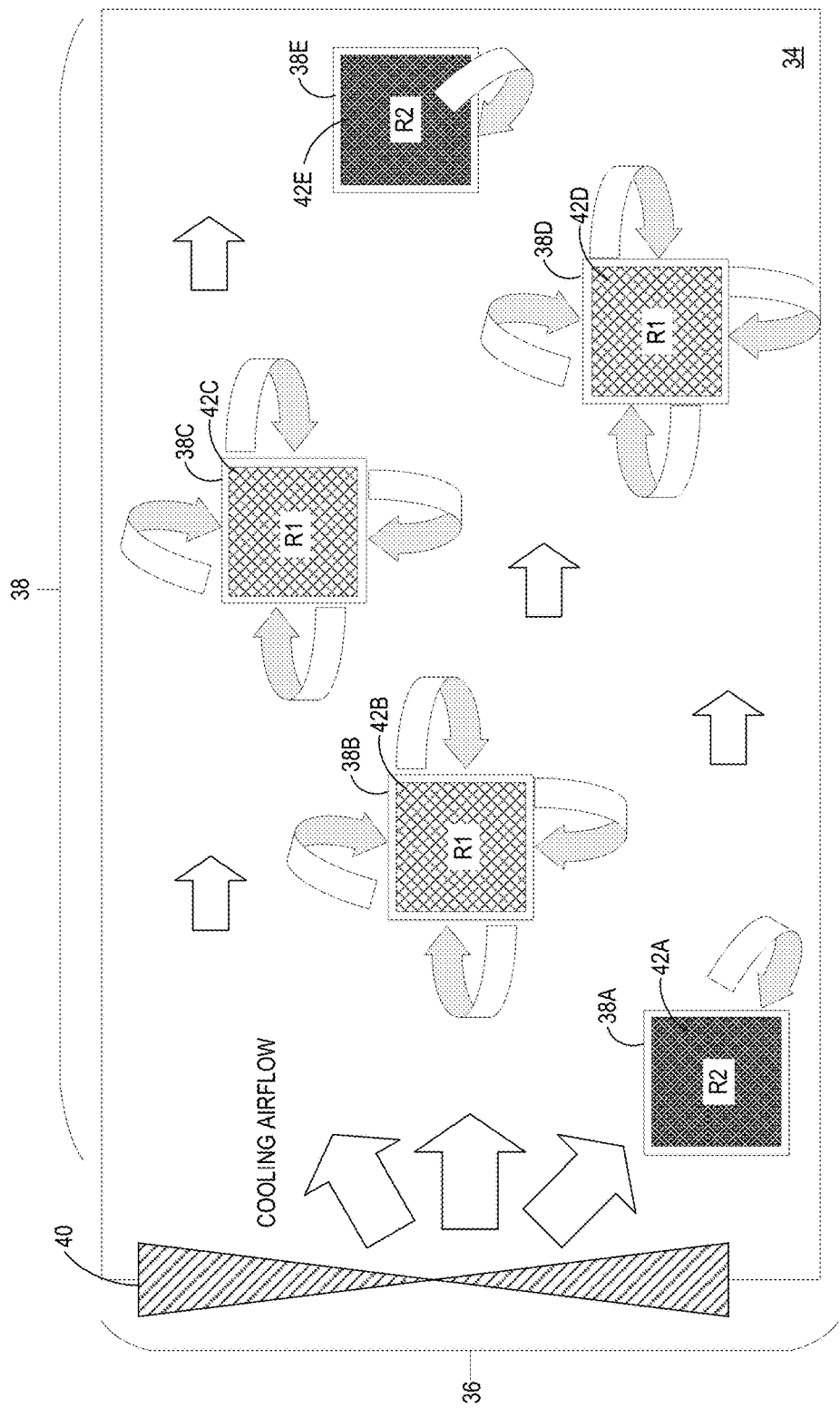
FIG. 5 is a schematic view that shows an overhead view of the example computing device of FIG. 1 with resistance meshes.
Figure 6:
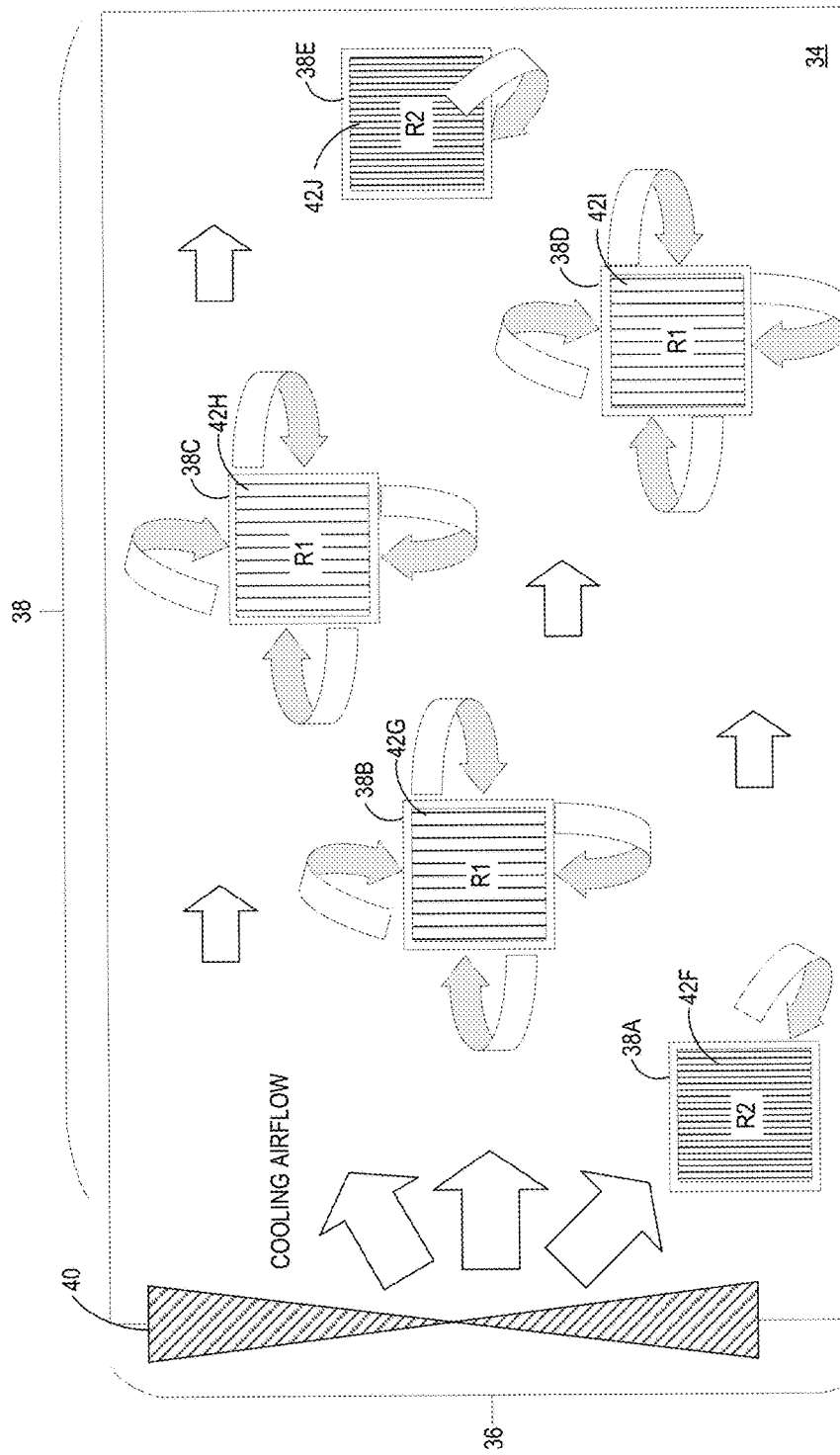
FIG. 6 is a schematic view that shows an overhead view of the example computing device of FIG. 1 with resistance grills.

Now turning to FIG. 5, an overhead view of the plenum 34 having a lateral airflow configuration is illustrated. As discussed previously, each of the plurality of outlet ports 38 includes a respective resistive element 42. In the illustrated example, the resistive elements include resistance meshes 42A-42E that have a static airflow resistance. The resistance meshes 42A-42E may be a mesh of any suitable material, such as a fiber mesh, a wire mesh, etc. In one example, the resistance meshes 42A-42E are constructed such that air flowing through the resistance meshes 42A-42E does not produce an audible noise. As shown, the resistance meshes 42A-42E have varied airflow resistances. In the illustrated example, resistance meshes 42A and 42E of the respective outlet ports 38A and 38E, have a second airflow resistance R2 compared to the resistance meshes 42B, 42C, and 42D, of the respective outlet ports 38B, 38C, and 38D, that have a first airflow resistance R1. However, as discussed previously, the resistance meshes 42A-42E may have any suitable configuration of airflow resistances, such as each resistance mesh having a different airflow resistance than each other resistance mesh.

Turning to FIG. 5, another overhead view of the plenum 34 having a lateral airflow configuration is illustrated. In this example, each of the plurality of outlet ports 38 have a respective resistive element 42 which include resistance grills 42F-42J. The resistance grills 42F-42J may, for example, include a plurality of blades arranged in a row. However, it will be appreciated that the resistance grills 42F-42J may take other forms, such as a grill with any suitable wire or blade pattern. In one example, the blades of the resistance grills 42F-42J are configured to dampen noise of the plenum 34. The resistance grills 42F-42J may have fixed blades and thus have fixed airflow resistances. In the illustrated example, the resistance grills 42F-42J have static airflow resistances, where resistance grills 42F and f2J have the second airflow resistance, and resistance grills 42G, 42H, and 42I, have the first airflow resistance. However, as discussed previously, the resistive elements, including resistance grills 42F-42J may have any suitable airflow resistance configuration.

In another example, the resistance grills 42F-42J may have motors to change an angle of the blades of the resistance grill, or otherwise modify the resistance grill configuration to change the airflow resistance of the resistance grill. In this manner, the resistive elements 42 which comprise resistance grills 42F-42J are configured to have dynamic airflow resistances. That is, the individual airflow resistance of the resistive elements 42 may be increased or decreased to control the ratio of airflow that is delivered to the plurality of electronic components.

Turning back to FIG. 3, the one or more temperature sensors 44 are configured to detect temperature values of one or more of the plurality of electronic components, and send those temperature values to the airflow control program executed by the processor 24 or a processing unit of the thermal venting device 32. In one example that includes resistive elements 42 having dynamic resistances, the airflow control program may be configured to control the dynamic airflow resistances of the resistive elements 42 based on temperature values detected by the one or more temperature sensors 44. For example, if the one or more temperature sensors 44 detect that the processor 24 has a temperature value that is higher than a threshold processor temperature value, such as, for example, 60 degrees Celsius, the airflow control program may be configured to reduce the airflow resistance of the resistive element for the outlet port directing airflow toward the processor 24 such that a larger portion of the total airflow from the plenum 34 is biased toward the processor 24. Alongside changing the dynamic airflow resistances of the resistive elements 42, the airflow control program may increase the fan speed of the inlet fan 40 to further increase the airflow directed toward the processor 24.

On the other hand, if an electronic component of the plurality of electronic components 20 has a detected temperature that is lower than a threshold temperature value, then the airflow control program may be configured to increase the airflow resistance of the resistive element for the outlet port directing airflow toward that electronic component such that a smaller portion of the total airflow from the plenum 34 is biased toward that electronic component. In this manner, the airflow control program may control the ratio of airflow that is directed to each electronic component of the plurality of electronic components 20 via controlling the dynamic airflow resistances of the resistive elements 42.

Figure 7:
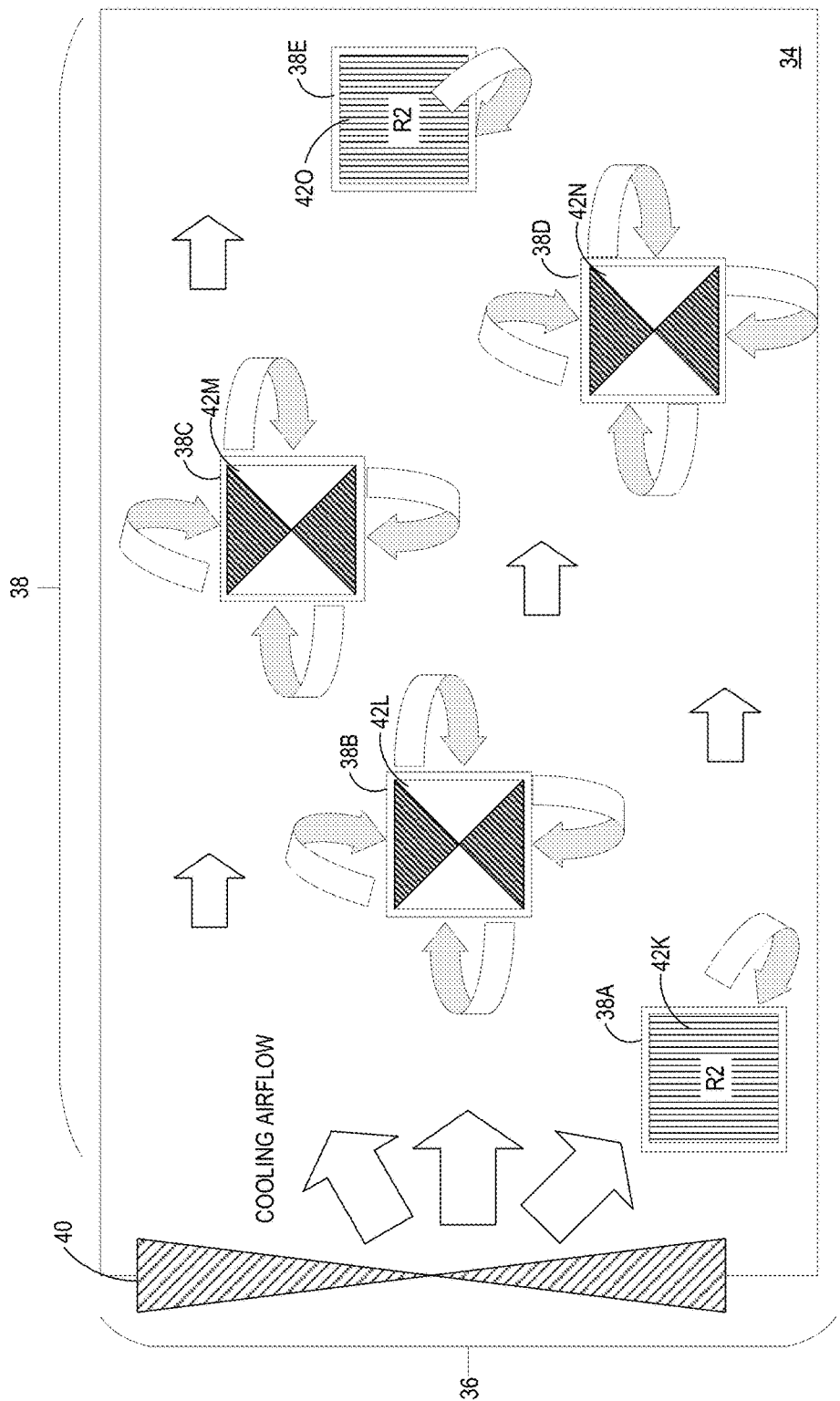
FIG. 7 is a schematic view that shows an overhead view of the example computing device of FIG. 1 with fans.

FIG. 7 illustrates another overhead view of the plenum 34 having a lateral airflow configuration. In the illustrated example, the resistive elements of outlet ports 38A-38E include both resistance grills 42K and 42O, and outlet fans 42L, 42M, and 42N. A outlet fan speed of the outlet fans 42L-42N may be controlled by the airflow control program to dynamically control the airflow resistance of the outlet fans 42L-42N. In one example, the airflow control program controls fan speeds of the inlet fan 40 and the outlet fans 42L, 42M, and 42N based on temperature values detected by the one or more temperature sensors 44. As a specific example, if the one or more temperature sensors 44 detect that the processor 24 has a temperature value that is higher than a threshold processor temperature value, such as, for example, 60 degrees Celsius, the airflow control program may be configured to increase a fan speed of the outlet fan for the outlet port directing airflow toward the processor 24 such that a larger portion of the total airflow from the plenum 34 is biased toward the processor 24.

On the other hand, if the one or more temperature sensors 44 detect that an electronic component has a temperature value that is below a threshold temperature value, the airflow control program may be configured to decrease a fan speed of the outlet fan for the outlet port directing airflow toward that electronic component such that a smaller portion of the total airflow from the plenum 34 is biased toward that electronic component, thus conserving energy.

In some examples, the resistive element 42 of an outlet port 38 includes multiple types of resistive elements. For example, the resistive element 42 may include both a resistance mesh and an outlet fan, or both a resistance grill and an outlet fan. In such a configuration, the resistive elements 42 of the plurality of outlet ports 38 may have characteristics of both static and dynamic airflow resistances. For example, the static airflow resistances of the resistance meshes may set a general airflow ratio that is directed toward the plurality of electronic components 20, and the airflow control program may dynamically control the airflow ratio via controlling a fan speed of one or more outlet fans based on temperatures detected by the one or more temperature sensors.

Figure 8:
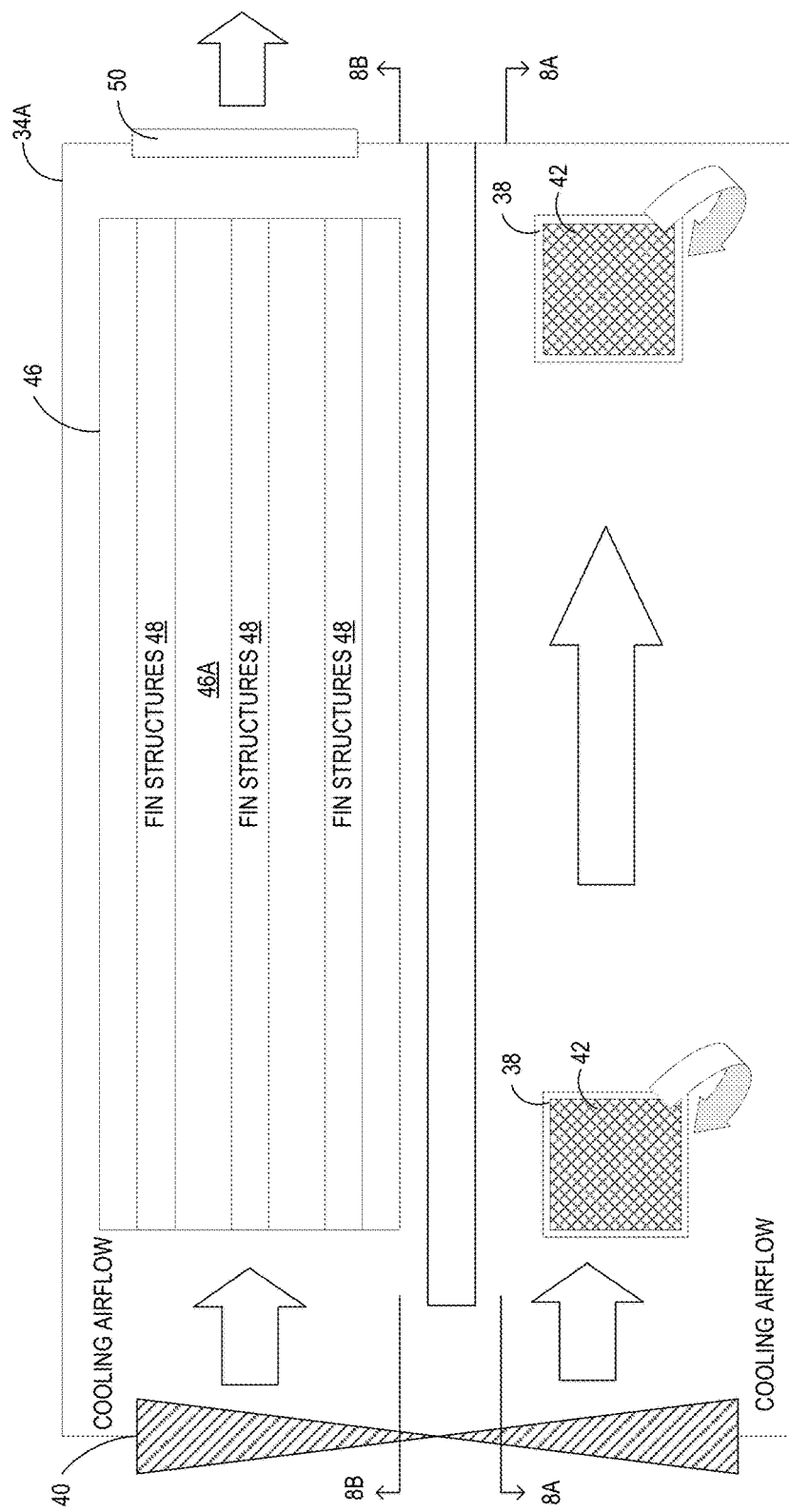
FIG. 8 is a schematic view that shows an overhead view of the example computing device of FIG. 1 with resistance meshes and a vapor chamber.

FIG. 8 illustrates an overhead view of an example plenum 34A that includes at least two chambers 8A/8B that are each pressurized by the inlet fan 40. In the illustrated example, a single inlet fan 40 pressurizes both of the chambers 8A and 8B. In another example, the example plenum 34A may include two inlet ports with two inlet fans 40, each inlet fan 40 pressurizing a different chamber 8A or 8B. Additionally, although only two chambers 8A and 8B are illustrated, it will be appreciated that the example plenum 34A may include any suitable number of chambers, such as three chambers, four chambers, etc.

As shown, the at least two chambers include a first chamber 8A configured to direct airflow to the plurality of outlet ports 38. The plurality of outlet ports 38 each include respective resistive elements 42, which, in this example, include resistive meshes. However, it will be appreciated that the resistive elements may alternatively or additionally include resistive grills, outlet fans, and/or other static or dynamic resistive elements.

The at least two chambers also include a second chamber 8B configured to direct airflow toward a cooling side 46A of a vapor chamber 46, the vapor chamber 46 being configured to conduct heat from one or more heat dissipating components of the plurality of electronic components 20. The one or more heat dissipating components may include electronic components such as the processor 24, the GPU 26, the PSU 28, and other electronic components that generate and dissipate larger amounts of heat compared to electronic components such as a non-volatile storage device 22. The vapor chamber 46 is configured to be in thermal contact with the one or more heat dissipating components, and conducts heat from the one or more heat dissipating components more efficiently than air.

As shown, the cooling side 46A is an upper side of the vapor chamber 46 that extends into the second chamber 8B of the example plenum 34A. The upper side of the vapor chamber 46 may be constructed of a material that has a high heat conductivity, such as copper or the like. The cooling side 46A of the vapor chamber 46 may further include heat spreading fins 48 that increase the surface area of the cooling side 46A of the vapor chamber 46, allowing the cooling air that is flowing across the cooling side 46A to efficiently conduct heat from the cooling side 46A of the vapor chamber 46. As shown, the inlet fan 40 pressurizes the example plenum 34A and generates a lateral airflow in the second chamber 8B that flows across the cooling side 46A of the vapor chamber 46 and is exhausted out of the example plenum 34A via an exhaust port 50. The exhaust port 50 directs the air outside of the housing 16 of the example computing device 12. In one example, the exhaust port 50 may also include a resistive element 42 to set a ratio of airflow that flows through the plurality of outlet ports 38 in the first chamber 8A and the exhaust port 50 of the second chamber 8B. In this manner, both the cooling side 46A of the vapor chamber 46 and the plurality of outlet ports 38 all received cooling airflow generated by the inlet fan 40.

Figure 9:
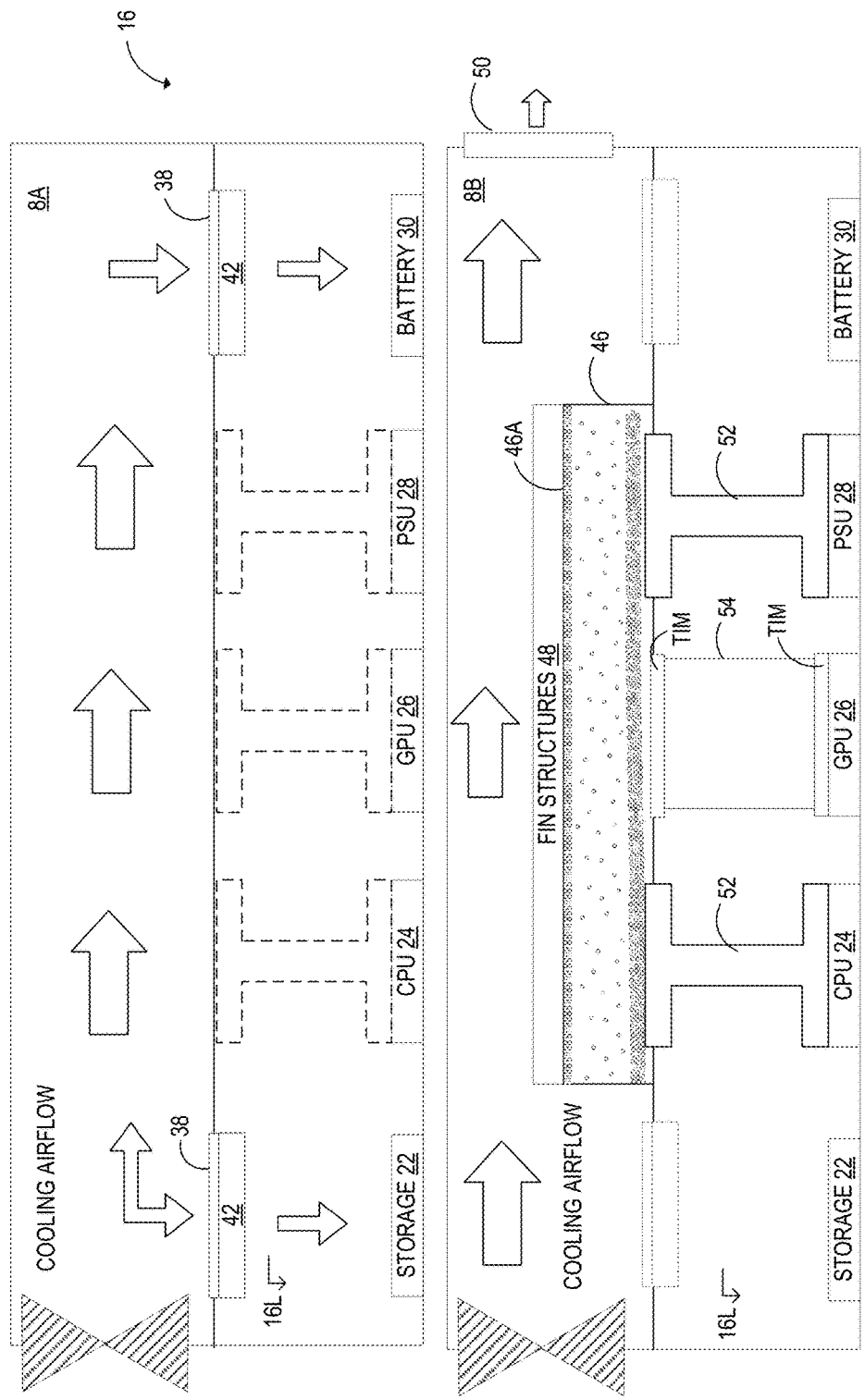
FIG. 9 is a schematic view that shows two sides of the example computing device of FIG. 8.

FIG. 9 illustrates side views of the first chamber 8A and the second chamber 8B, and the portions of the lower end 16L of the housing 16 directly below the first chamber 8A and the second chamber 8B. As shown, a cooling airflow in the first chamber 8A flows through the plurality of outlet ports 38 due to a pressure drop between the plenum 34 and the lower end 16L of the housing 16. The plurality of outlet ports 38 direct the airflow toward one or more of the plurality of electronic components 20, which, in this specific example, includes the non-volatile storage device 22 and the battery 30.

Concurrently, a cooling airflow in the second chamber 8B flows across the cooling side 46A, which may include heat spreading fins 48, of the vapor chamber 46 before being exhausted out the exhaust port 50. The vapor chamber 46 is in thermal contact with the one or more heat dissipating components of the plurality of electronic components 20, which includes the processor 24, the GPU 26, and the PSU 28 in this example. In one example, the vapor chamber 46 may extend downwards into the lower end 16L of the plenum and directly contact the one or more heat dissipating components. For example, a bottom side of the vapor chamber 46 may be constructed of a material having a high thermal conductivity, and may be located to come into thermal contact with the one or more heat dissipating components. A thermal interface material (TIM) may be placed between any thermal contact points to improve thermal conductivity between the vapor chamber 46 and the one or more heat dissipating components.

In another example, the vapor chamber 46 conducts heat from the one or more heat dissipating components via a heat pipe 52 that extends downward to thermally contact the one or more heat dissipating components. As illustrated in FIG. 9, the vapor chamber 46 includes a plurality of heat pipes 52 that extend downward and thermally contact the heat dissipating components, which include the processor 24, the GPU 26, and the PSU 28 in this example. The plurality of heat pipes 52 may form a closed vapor system with the vapor chamber 46, such that the vapor conducts heat from the heat dissipating components at a lower end of the plurality of heat pipes 52 that are in thermal contact with the heat dissipating components. The heated vapor then condenses at the cooling side 46A within the vapor chamber 46, and travels back downward through the plurality of heat pipes 52 to conduct more heat from the heat dissipating components. It will be appreciated that any suitable configuration of vapor chambers 46 and heat pipes 52 may be used to efficiently conduct heat from the heat dissipating components.

In another example, the vapor chamber 46 conducts heat from the one or more heat dissipating components via a heat sink 54 that is thermally connected to the vapor chamber 46 and the one or more heat dissipating components. For example, one or more heat sinks 54 may be in thermal contact with both the heat dissipating components and a lower end of the vapor chamber 46. Thermal conductivity of the thermal contact with both the vapor chamber 46 and the heat dissipating components may be improved via a thermal interface material between each contact points. In some examples, the vapor chamber 46 conducts heat from the one or more heat dissipating components via both heat sinks 54 and heat pipes 52.

In some embodiments, the methods and processes described herein may be tied to a computing system of one or more computing devices. In particular, such methods and processes may be implemented as a computer-application program or service, an application-programming interface (API), a library, and/or other computer-program product.

Figure 10:
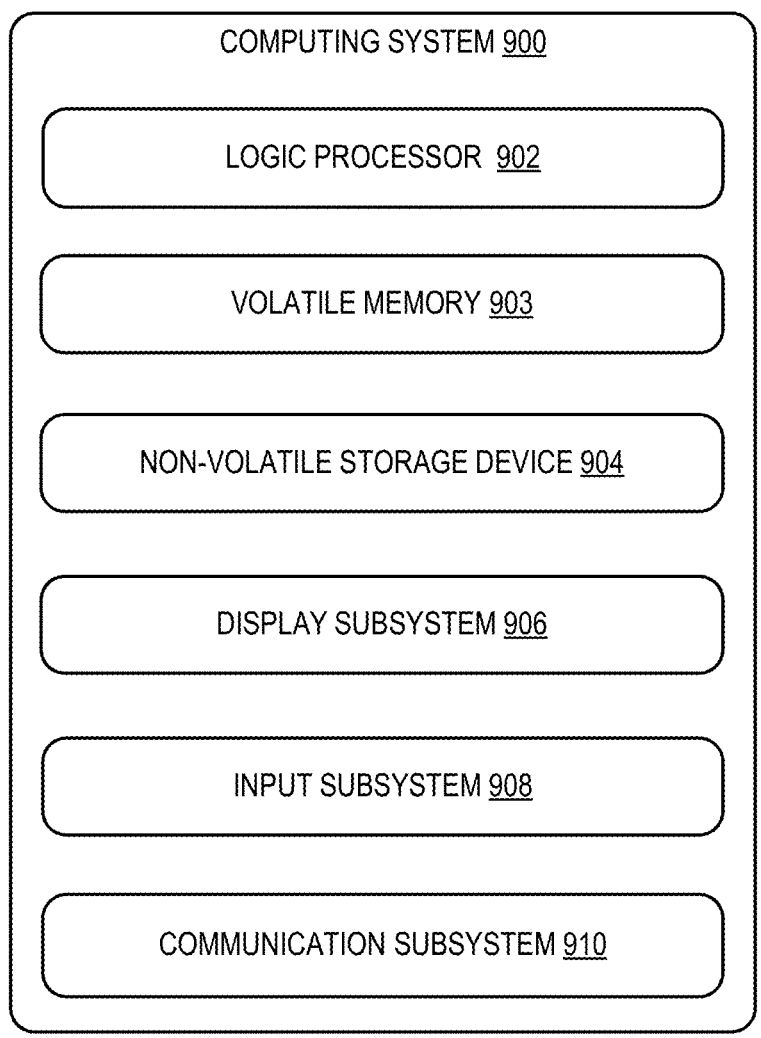
FIG. 10 is a schematic view of exemplary computer hardware that may be used in the computing device of FIG. 1.

FIG. 10 schematically shows a non-limiting embodiment of a computing system 900 that can enact one or more of the methods and processes described above. Computing system 900 is shown in simplified form. Computing system 900 may embody the example computing device 12 described above. Computing system 900 may take the form of one or more personal computers, server computers, tablet computers, home-entertainment computers, network computing devices, gaming devices, mobile computing devices, mobile communication devices (e.g., smart phone), and/or other computing devices, and wearable computing devices such as smart wristwatches and head mounted augmented reality devices.

Computing system 900 includes a logic processor 902 volatile memory 904, and a non-volatile storage device 906. Computing system 900 may optionally include a display subsystem 908, input subsystem 910, communication subsystem 912, and/or other components not shown in FIG. 10.

Logic processor 902 includes one or more physical devices configured to execute instructions. For example, the logic processor may be configured to execute instructions that are part of one or more applications, programs, routines, libraries, objects, components, data structures, or other logical constructs. Such instructions may be implemented to perform a task, implement a data type, transform the state of one or more components, achieve a technical effect, or otherwise arrive at a desired result.

The logic processor may include one or more physical processors (hardware) configured to execute software instructions. Additionally or alternatively, the logic processor may include one or more hardware logic circuits or firmware devices configured to execute hardware-implemented logic or firmware instructions. Processors of the logic processor 902 may be single-core or multi-core, and the instructions executed thereon may be configured for sequential, parallel, and/or distributed processing. Individual components of the logic processor optionally may be distributed among two or more separate devices, which may be remotely located and/or configured for coordinated processing. Aspects of the logic processor may be virtualized and executed by remotely accessible, networked computing devices configured in a cloud-computing configuration. In such a case, these virtualized aspects are run on different physical logic processors of various different machines, it will be understood.

Non-volatile storage device 906 includes one or more physical devices configured to hold instructions executable by the logic processors to implement the methods and processes described herein. When such methods and processes are implemented, the state of non-volatile storage device 904 may be transformed—e.g., to hold different data.

Non-volatile storage device 906 may include physical devices that are removable and/or built-in. Non-volatile storage device 94 may include optical memory (e.g., CD, DVD, HD-DVD, Blu-Ray Disc, etc.), semiconductor memory (e.g., ROM, EPROM, EEPROM, FLASH memory, etc.), and/or magnetic memory (e.g., hard-disk drive, floppy-disk drive, tape drive, MRAM, etc.), or other mass storage device technology. Non-volatile storage device 906 may include nonvolatile, dynamic, static, read/write, read-only, sequential-access, location-addressable, file-addressable, and/or content-addressable devices. It will be appreciated that non-volatile storage device 906 is configured to hold instructions even when power is cut to the non-volatile storage device 906.

Volatile memory 904 may include physical devices that include random access memory. Volatile memory 904 is typically utilized by logic processor 902 to temporarily store information during processing of software instructions. It will be appreciated that volatile memory 904 typically does not continue to store instructions when power is cut to the volatile memory 904.

Aspects of logic processor 902, volatile memory 904, and non-volatile storage device 906 may be integrated together into one or more hardware-logic components. Such hardware-logic components may include field-programmable gate arrays (FPGAs), program- and application-specific integrated circuits (PASIC/ASICs), program- and application-specific standard products (PSSP/ASSPs), system-on-a-chip (SOC), and complex programmable logic devices (CPLDs), for example.

The terms "module," "program," and "engine" may be used to describe an aspect of computing system 900 typically implemented in software by a processor to perform a particular function using portions of volatile memory, which function involves transformative processing that specially configures the processor to perform the function. Thus, a module, program, or engine may be instantiated via logic processor 902 executing instructions held by non-volatile storage device 906, using portions of volatile memory 904. It will be understood that different modules, programs, and/or engines may be instantiated from the same application, service, code block, object, library, routine, API, function, etc. Likewise, the same module, program, and/or engine may be instantiated by different applications, services, code blocks, objects, routines, APIs, functions, etc. The terms "module," "program," and "engine" may encompass individual or groups of executable files, data files, libraries, drivers, scripts, database records, etc.

When included, display subsystem 908 may be used to present a visual representation of data held by non-volatile storage device 906. The visual representation may take the form of a graphical user interface (GUI). As the herein described methods and processes change the data held by the non-volatile storage device, and thus transform the state of the non-volatile storage device, the state of display subsystem 908 may likewise be transformed to visually represent changes in the underlying data. Display subsystem 908 may include one or more display devices utilizing virtually any type of technology. Such display devices may be combined with logic processor 902, volatile memory 904, and/or non-volatile storage device 906 in a shared enclosure, or such display devices may be peripheral display devices.

When included, input subsystem 910 may comprise or interface with one or more user-input devices such as a keyboard, mouse, touch screen, or game controller. In some embodiments, the input subsystem may comprise or interface with selected natural user input (NUI) componentry. Such componentry may be integrated or peripheral, and the transduction and/or processing of input actions may be handled on- or off-board. Example NUI componentry may include a microphone for speech and/or voice recognition; an infrared, color, stereoscopic, and/or depth camera for machine vision and/or gesture recognition; a head tracker, eye tracker, accelerometer, and/or gyroscope for motion detection and/or intent recognition; as well as electric-field sensing componentry for assessing brain activity; and/or any other suitable sensor.

When included, communication subsystem 912 may be configured to communicatively couple various computing devices described herein with each other, and with other devices. Communication subsystem 912 may include wired and/or wireless communication devices compatible with one or more different communication protocols. As non-limiting examples, the communication subsystem may be configured for communication via a wireless telephone network, or a wired or wireless local- or wide-area network, such as a HDMI over Wi-Fi connection. In some embodiments, the communication subsystem may allow computing system 900 to send and/or receive messages to and/or from other devices via a network such as the Internet.

The following paragraphs provide additional support for the claims of the subject application. One aspect provides a thermal venting device comprising a plenum including an inlet port and a plurality of outlet ports, the plenum being substantially fluidically sealed except for the inlet port and the plurality of outlet ports, the inlet port including an inlet fan configured to pressurize the plenum, each of the plurality of outlet ports being configured to direct airflow from the pressurized plenum toward different electronic components of a plurality of electronic components, and each of the plurality of outlet ports including respective resistive elements having varied airflow resistances configured to bias airflow through the plurality of outlet ports. In this aspect, additionally or alternatively, at least one resistive element may have a first airflow resistance and at least one resistive element may have a second airflow resistance, wherein the first airflow resistance may be lower than the second airflow resistance. In this aspect, additionally or alternatively, the resistive elements may include resistance meshes. In this aspect, additionally or alternatively, the resistive elements may include resistance grills. In this aspect, additionally or alternatively, blades of the resistance grills may be configured to dampen noise. In this aspect, additionally or alternatively, the resistive elements may include outlet fans. In this aspect, additionally or alternatively, the inlet port and the inlet fan may be configured to generate a lateral airflow having an airflow direction that is lateral to an airflow direction of the plurality of outlet ports. In this aspect, additionally or alternatively, the inlet port and the inlet fan may be configured to generate an impinging airflow having an airflow direction that is substantially parallel to an airflow direction of the plurality of outlet ports. In this aspect, additionally or alternatively, the resistive elements may be configured to have static airflow resistances. In this aspect, additionally or alternatively, may further include one or more temperature sensors configured to detect temperature values of one or more of the plurality of electronic components, and a processor configured to execute an airflow control program that may control a fan speed of the inlet fan based on temperature values detected by the one or more temperature sensors and airflow resistances of the resistive elements. In this aspect, additionally or alternatively, the resistive elements may be configured to have dynamic airflow resistances. In this aspect, additionally or alternatively, may further include one or more temperature sensors configured to detect temperature values of one or more of the plurality of electronic components, and a processor configured to execute an airflow control program that may control the dynamic airflow resistances of the resistive elements based on temperature values detected by the one or more temperature sensors. In this aspect, additionally or alternatively, the resistive elements may include outlet fans, and wherein the airflow control program may control fan speeds of the inlet fan and the outlet fans based on temperature values detected by the one or more temperature sensors. In this aspect, additionally or alternatively, the plenum may include at least two chambers that are each pressurized by the inlet fan, the at least two chambers including a first chamber configured to direct airflow to the plurality of outlet ports, and a second chamber configured to direct airflow toward a cooling side of a vapor chamber, the vapor chamber being configured to conduct heat from one or more heat dissipating components of the plurality of electronic components. In this aspect, additionally or alternatively, the vapor chamber may conduct heat from the one or more heat dissipating components via a heat sink that is thermally connected to the vapor chamber and the one or more heat dissipating components. In this aspect, additionally or alternatively, the vapor chamber may conduct heat from the one or more heat dissipating components via a heat pipe that extends downward to thermally contact the one or more heat dissipating components.

Another aspect provides a computing device comprising, a housing having a width of at least 200 millimeters, a height of at least 25 millimeters, and a depth of at least 200 millimeters, a plurality of electronic components mounted on a lower end of the housing, the plurality of electronic components including a processor and a non-volatile storage device, a plenum mounted on an upper end of the housing, the plenum being substantially fluidically sealed except for an inlet port and a plurality of outlet ports, the inlet port including an inlet fan configured to pressurize the plenum, each of the plurality of outlet ports being configured to direct airflow from the pressurized plenum toward different electronic components of a plurality of electronic components, and each of the plurality of outlet ports including respective resistive elements having varied airflow resistances configured to bias airflow through the plurality of outlet ports such that more airflow is directed toward the processor than the non-volatile storage device of the plurality of electronic devices. In this aspect, additionally or alternatively, at least one resistive element may have a first airflow resistance and at least one resistive element may have a second airflow resistance, wherein the first airflow resistance may be lower than the second airflow resistance. In this aspect, additionally or alternatively, may further include one or more temperature sensors configured to detect temperature values of one or more of the plurality of electronic components, and the processor may be configured to execute an airflow control program that may control a fan speed of the inlet fan based on temperature values detected by the one or more temperature sensors and airflow resistances of the resistive elements.

Another aspects provides a thermal venting device comprising a plenum including an inlet port and a plurality of outlet ports, the plenum being substantially fluidically sealed except for the inlet port and the plurality of outlet ports, the inlet port including an inlet fan configured to pressurize the plenum, each of the plurality of outlet ports being configured to direct airflow from the pressurized plenum toward different electronic components of a plurality of electronic components, and each of the plurality of outlet ports including respective resistive elements having varied airflow resistances configured to bias airflow through the plurality of outlet ports, wherein the resistive element for one or more of the plurality of outlet ports includes both a resistive mesh and an outlet fan.

It will be understood that the configurations and/or approaches described herein are exemplary in nature, and that these specific embodiments or examples are not to be considered in a limiting sense, because numerous variations are possible. The specific routines or methods described herein may represent one or more of any number of processing strategies. As such, various acts illustrated and/or described may be performed in the sequence illustrated and/or described, in other sequences, in parallel, or omitted. Likewise, the order of the above-described processes may be changed.

The subject matter of the present disclosure includes all novel and non-obvious combinations and sub-combinations of the various processes, systems and configurations, and other features, functions, acts, and/or properties disclosed herein, as well as any and all equivalents thereof.

The invention claimed is:

1. A thermal venting device comprising:
a plenum including an inlet port and a plurality of outlet ports, the plenum being substantially fluidically sealed except for the inlet port and the plurality of outlet ports,
the inlet port including an inlet fan configured to pressurize the plenum,
each of the plurality of outlet ports being configured to direct an airflow from the pressurized plenum toward different electronic components of a plurality of electronic components including a processor and a non-volatile storage device, and
each of the plurality of outlet ports including a respective resistive element having an airflow resistance, wherein at least one resistive element has a different airflow resistance than another resistive element, such that the airflow is biased through the plurality of outlet ports such that more of the airflow is directed toward the processor than the non-volatile storage device of the plurality of electronic components; and
one or more temperature sensors configured to detect temperature values of one or more of the plurality of electronic components, wherein an airflow control program executable by the processor or another processing unit controls a fan seed of the inlet fan based on temperature values detected by the one or more temperature sensors and airflow resistances of the resistive elements.

2. The thermal venting device of claim 1, wherein the resistive elements include resistance meshes.

3. The thermal venting device of claim 1, wherein the resistive elements include resistance grills.

4. The thermal venting device of claim 3, wherein blades of the resistance grills are configured to dampen noise.

5. The thermal venting device of claim 1, wherein the resistive elements include outlet fans.

6. The thermal venting device of claim 1, wherein the inlet port and the inlet fan are configured to generate a lateral airflow having an airflow direction that is substantially perpendicular to an airflow direction of the plurality of outlet ports.

7. The thermal venting device of claim 1, wherein the inlet port and the inlet fan are configured to generate an impinging airflow having an airflow direction that is substantially parallel to an airflow direction of the plurality of outlet ports.

8. The thermal venting device of claim 1, wherein the resistive elements are configured to have static airflow resistances.

9. The thermal venting device of claim 1, wherein the resistive elements are configured to have dynamic airflow resistances.

10. The thermal venting device of claim 9, wherein the airflow control program is further configured to control the dynamic airflow resistances of the resistive elements based on temperature values detected by the one or more temperature sensors.

11. The thermal venting device of claim 10, wherein the resistive elements include outlet fans, and
wherein the airflow control program controls fan speeds of the inlet fan and the outlet fans based on temperature values detected by the one or more temperature sensors.

12. A thermal venting device comprising:
a plenum including an inlet port and a plurality of outlet ports, the plenum being substantially fluidically sealed except for the inlet port and the plurality of outlet ports,
the inlet port including an inlet fan configured to pressurize the plenum,
each of the plurality of outlet ports being configured to direct an airflow from the pressurized plenum toward different electronic components of a plurality of electronic components, and
each of the plurality of outlet ports including respective resistive elements having varied airflow resistances configured to bias the airflow through the plurality of outlet ports;
wherein the plenum includes at least two chambers that are each pressurized by the inlet fan, the at least two chambers including:
a first chamber configured to direct the airflow to the plurality of outlet ports; and
a second chamber configured to direct the airflow toward a cooling side of a vapor chamber, the vapor chamber being configured to conduct heat from one or more heat dissipating components of the plurality of electronic components.

13. The thermal venting device of claim 12, wherein the vapor chamber conducts heat from the one or more heat dissipating components via a heat sink that is thermally connected to the vapor chamber and the one or more heat dissipating components.

14. The thermal venting device of claim 13, wherein the vapor chamber conducts heat from the one or more heat dissipating components via a heat pipe that extends downward to thermally contact the one or more heat dissipating components.

15. A computing device comprising,
   a housing having a width of at least 200 millimeters, a height of at least 25 millimeters, and a depth of at least 200 millimeters;
   a plurality of electronic components mounted on a lower end of the housing, the plurality of electronic components including a processor and a non-volatile storage device;
   one or more temperature sensors configured to detect temperature values of one or more of the plurality of electronic components;
   a plenum mounted on an upper end of the housing, the plenum being substantially fluidically sealed except for an inlet port and a plurality of outlet ports,
      the inlet port including an inlet fan configured to pressurize the plenum,
      each of the plurality of outlet ports being configured to direct an airflow from the pressurized plenum toward different electronic components of a plurality of electronic components, and
      each of the plurality of outlet ports including a respective resistive element having an airflow resistance, wherein at least one resistive element has a different airflow resistance than another resistive element, such that the airflow is biased through the plurality of outlet ports such that more of the airflow is directed toward the processor than the non-volatile storage device of the plurality of electronic components; and
   wherein the processor is configured to execute an airflow control program that controls a fan speed of the inlet fan based on temperature values detected by the one or more temperature sensors and airflow resistances of the resistive elements.

* * * * *